(12) United States Patent
Yagi

(10) Patent No.: US 11,621,538 B2
(45) Date of Patent: Apr. 4, 2023

(54) WAVELENGTH TUNABLE LASER DEVICE AND METHOD FOR MANUFACTURING THE SAME

(71) Applicant: SUMITOMO ELECTRIC INDUSTRIES, LTD., Osaka (JP)

(72) Inventor: Hideki Yagi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 364 days.

(21) Appl. No.: 17/030,628

(22) Filed: Sep. 24, 2020

(65) Prior Publication Data

US 2021/0098963 A1  Apr. 1, 2021

(30) Foreign Application Priority Data

Oct. 1, 2019 (JP) .............................. JP2019-181331

(51) Int. Cl.
| | |
|---|---|
| *H01S 5/026* | (2006.01) |
| *H01S 5/02* | (2006.01) |
| *H01S 5/12* | (2021.01) |
| *H01S 5/10* | (2021.01) |
| *H01S 5/343* | (2006.01) |

(52) U.S. Cl.
CPC .............. *H01S 5/026* (2013.01); *H01S 5/021* (2013.01); *H01S 5/0215* (2013.01); *H01S 5/1014* (2013.01); *H01S 5/1209* (2013.01); *H01S 5/34306* (2013.01)

(58) Field of Classification Search
CPC ........ H01S 5/026; H01S 5/021; H01S 5/0215; H01S 5/1014; H01S 5/1209; H01S 5/34306
See application file for complete search history.

(56) References Cited

U.S. PATENT DOCUMENTS

| | | | |
|---|---|---|---|
| 2015/0207296 A1* | 7/2015 | Rickman | ................. H01S 5/021 |
| | | | 372/20 |
| 2020/0174194 A1* | 6/2020 | Kojima | .............. G02B 6/12004 |

OTHER PUBLICATIONS

Minh A. Tran, et al., "Multi-ring Mirror-based Narrow-Linewidth Widely-Tunable Lasers in Heterogeneous Silicon Photonics," 2018 European Conference on Optical Communication (ECOC), Tu1C. 5, DOI: 10.1109/ECOC.2018.8535537, 3 pgs.

* cited by examiner

*Primary Examiner* — Yuanda Zhang
(74) *Attorney, Agent, or Firm* — Volpe Koenig

(57) ABSTRACT

A wavelength tunable laser device includes a substrate including silicon, the substrate having a waveguide, a first semiconductor element bonded to the substrate, the first semiconductor element including an active layer of a group III-V compound semiconductor, and a second semiconductor element bonded to the substrate, the second semiconductor element facing to the first semiconductor element in a direction along which light emitted from the first semiconductor element propagates, the second semiconductor element including a grating formed of a group III-V compound semiconductor. The grating selects a wavelength of light.

8 Claims, 11 Drawing Sheets

WAVELENGTH TUNABLE LASER DEVICE AND METHOD FOR MANUFACTURING THE SAME

CROSS-REFERENCE TO RELATED APPLICATION

The present disclosure contains subject matter related to Japanese Patent Application No. 2019-181331 filed in the Japan Patent Office on Oct. 1, 2019, the entire contents of which are incorporated herein by reference.

TECHNICAL FIELD

The present disclosure relates to a wavelength tunable laser device and a method of manufacturing the same.

BACKGROUND OF THE DISCLOSURE

An optical semiconductor device in which a light-emitting element obtained from a compound semiconductor substrate is bonded to an SOI (Silicon On Insulator) substrate on which a waveguide is formed has been developed, as described in the non-patent literature Minh A. Tran et al., "Multi-Ring Mirror-Based Narrow-Linewidth Widely-Tunable Lasers in Heterogeneous Silicon Photonics", 2018 European Conference on Optical Communication (ECOC), Tu1C. 5, DOI: 10.1109/ECOC. 2018.8535537.

SUMMARY OF THE DISCLOSURE

The SOI substrate is made of silicon (Si) to form a waveguide and a resonator. A light emitted by a chip consisting of compound semiconductor layers is propagated in the waveguide, and the wavelength of the light is selected by the resonator. However, two-photon absorption may occur in the waveguide and the resonator, and the refractive index of the waveguide and the resonator may fluctuate. This fluctuation causes a shift in wavelength selected by the resonator and an increase in spectral linewidth, making it difficult to obtain the desired tunable laser characteristics. Therefore, it is important to provide a wavelength tunable laser device having a stable wavelength tuning characteristics and narrow spectral linewidth.

A wavelength tunable laser device according to the present disclosure includes a substrate including silicon, the substrate having a waveguide; a first semiconductor element bonded to the substrate, the first semiconductor element including an active layer of a first group III-V compound semiconductor; and a second semiconductor element bonded to the substrate, the second semiconductor element being opposed to the first semiconductor element in a direction along which a light emitted from the first semiconductor element propagates, the second semiconductor element including a grating formed of a second group III-V compound semiconductor. The grating selects a wavelength of the light.

A method for manufacturing a wavelength tunable laser device according to the present disclosure includes the steps of bonding a first semiconductor element including an active layer of a first group III-V compound semiconductor to a substrate including silicon, the substrate having a waveguide, bonding a second semiconductor element to a position of the substrate facing to the first semiconductor element in a direction along which a light emitted from the first semiconductor element propagates, and forming a grating of a second group III-V compound semiconductor on the second semiconductor element for selecting a wavelength of the light.

DESCRIPTION OF THE PREFERRED EMBODIMENTS

Description of Embodiments of the Disclosure

Figure 1A:
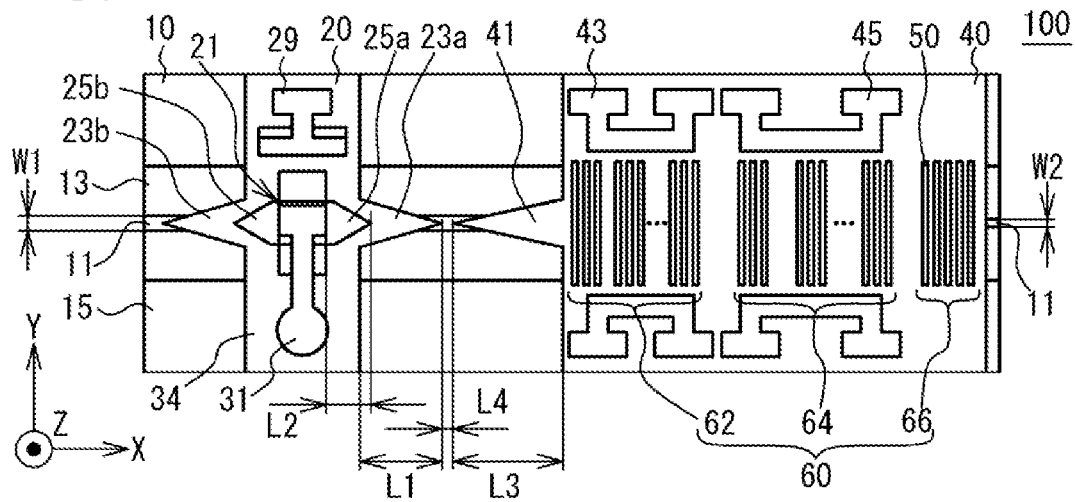
FIG. 1A is a plan view illustrating a wavelength tunable laser device according to an embodiment.

First, embodiments of the present invention will be listed and described.

(1) One embodiment of the present disclosure is a wavelength tunable laser device, including a substrate including silicon, the substrate having a waveguide, a first semiconductor element bonded to the substrate, the first semiconductor element including an active layer of a first group III-V compound semiconductor, and a second semiconductor element bonded to the substrate, the second semiconductor element facing to the first semiconductor element in a direction along which light emitted from the first semiconductor element propagates, the second semiconductor element including a grating formed of a second group III-V compound semiconductor. The grating selects a wavelength of the light. In the grating formed of the second group III-V compound semiconductor selected from III-V group compound semiconductors, two-photon absorption is less likely to occur. Therefore, stable tunable laser characteristics can be obtained.

(2) The grating may include a first partial grating, a second partial grating, and a reflecting portion arranged in order from a side of the first semiconductor element along an extending direction of the waveguide, the first partial grating and the second partial grating select the wavelength of the light, the reflecting portion reflects the light having the wavelength. The wavelength of the light is controlled by using Vernier effect between the first partial grating and the second partial grating. The reflecting portion reflects light having the wavelength. Two-photon absorption hardly occurs in the first partial grating, the second partial grating and the reflecting portion. Therefore, stable tunable laser characteristics can be obtained.

(3) The first partial grating may include a plurality of third partial gratings, the second partial grating may include a plurality of fourth partial gratings. A spacing among the third partial gratings may be different from a spacing among the fourth partial gratings. The wavelength of the light is controlled by using Vernier effect between the first partial grating and the second partial grating. Therefore, it is possible to stably control the oscillation wavelength.

(4) The second semiconductor element may include a first semiconductor layer and a second semiconductor layer stacked in order and formed of group III-V compound semiconductors, and the grating may include a plurality of the second semiconductor layers arranged along the extending direction of the waveguide. Since a confinement of light in the first and second semiconductor layers are weak, two-photon absorption is suppressed. Therefore, stable tunable laser characteristics can be obtained.

(5) The first semiconductor layer and the second semiconductor layer may be formed of a compound semiconductor containing indium and phosphorus. Since the light confinement in the first and the second semiconductor layers containing indium and phosphorus is weak, two-photon absorption is suppressed. Therefore, stable tunable laser characteristics can be obtained.

(6) The first semiconductor element may include a first electrode, a second electrode, a third semiconductor layer, the active layer, and a fourth semiconductor layer, the third semiconductor layer, the active layer, the fourth semiconductor layer being stacked in order. The third semiconductor layer is located on the waveguide and has a first tapered portion tapered along the extending direction of the waveguide. The active layer and the fourth semiconductor layer are located over the waveguide and have a second tapered portion tapered along the extending direction of the waveguide. The first tapered portion is longer than the second tapered portion. The first electrode is provided on the third semiconductor layer. The second electrode is provided on the fourth semiconductor layer, and the second electrode may not be provided on the second tapered portion. An optical coupling between the first semiconductor element and the waveguide is enhanced by the first tapered portion and the second tapered portion. By shortening the second tapered portion, an influence of absorption of the light can be suppressed small even if the second electrode is not provided on the second tapered portion.

(7) The second semiconductor element being opposed to the first semiconductor element may be located on the waveguide, and may have a third tapered portion narrowed along the extending direction of the waveguide. An optical coupling between the second semiconductor element and the waveguide becomes strong.

(8) The substrate may further include a silicon oxide layer and a silicon layer stacked on the silicon oxide layer, and the waveguide may be formed of the silicon layer. Since the light confinement of silicon is strong, two-photon absorption tends to occur in the waveguide formed of the silicon layer. Two-photon absorption is suppressed in the second semiconductor element for controlling the wavelength by the grating. Thus, stable tunable laser characteristics can be obtained.

(9) One embodiment of the present disclosure is a method for manufacturing a wavelength tunable laser device, including the steps of bonding a first semiconductor element including an active layer of a first group III-V compound semiconductor to a substrate including silicon, the substrate having a waveguide, bonding a second semiconductor element to a position of the substrate opposing to the first semiconductor element in a direction along which a light emitted from the first semiconductor element propagates, and forming a grating of a second group III-V compound semiconductor on the second semiconductor element for selecting a wavelength of the light. In the grating formed by III-V group compound semiconductors, two-photon absorption is less likely to occur. Therefore, stable tunable laser characteristics can be obtained.

(10) The first semiconductor element and the second semiconductor element may have equal thicknesses. The step of forming the grating may be performed after the steps of bonding the first semiconductor element and bonding the second semiconductor element. The first semiconductor element and the second semiconductor element may be bonded simultaneously to the substrate in a single step. Since the thicknesses of the first semiconductor element and the second semiconductor element are equal, weighting for pressing the first and second semiconductor elements during the step of bonding is uniformly applied. Thus, the bonding strength is improved. Further, since the grating is formed after the bonding and an alignment between the grating and the waveguide is performed by lithography, the accuracy of the alignment is improved.

Details of Embodiments of the Disclosure

A specific example of a wavelength tunable laser device and a method for manufacturing the wavelength tunable laser device according to the present invention will be described below with reference to the drawings. It should be noted that the present disclosure is not limited to these examples, but is indicated by the claims, and all changes that come within the meaning and range equivalency of the claims are intended to be embraced therein.

(Tunable Laser Element)

Figure 1B:
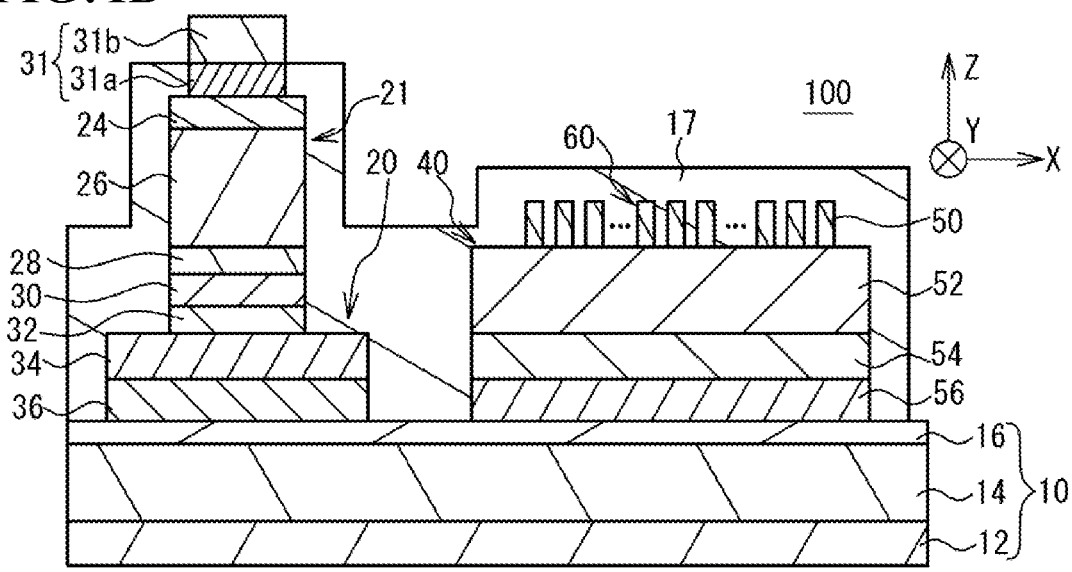
FIG. 1B is a cross-sectional view illustrating a wavelength tunable laser device.

FIG. 1A is a plan view illustrating a wavelength tunable laser device 100 according to an embodiment of the present disclosure. FIG. 1B is a cross-sectional view illustrating the wavelength tunable laser device 100, and illustrates a cross-section along the waveguide 11. The wavelength tunable laser device 100 includes a plurality of waveguides 11 arranged along a Y-axis direction, a chip 20 and a chip 40. FIG. 1A and FIG. 1B show around one of the waveguide 11. As shown in FIG. 1A and FIG. 1B, the wavelength tunable laser device 100 includes a substrate 10, the chip 20 (first semiconductor element), and the chip 40 (second semiconductor element). An X-axis direction, the Y-axis direction, and a Z axis direction are orthogonal to each other. The X-axis direction is a direction along which the chip 20 and the chip 40 are arranged. A surface of the substrate 10 extends in a XY plane. The Z-axis direction is normal to the surface of the substrate 10.

As shown in FIG. 1A, the substrate 10 is an SOI substrate in which a substrate 12, a silicon oxide ($SiO_2$) layer 14, and a silicon (Si) layer 16 are stacked in this order. As shown in FIG. 1A, the waveguide 11, a groove 13 and a terrace 15 are formed on the surface of the substrate 10. The Grooves 13 are located on both sides of the waveguide 11. The terraces 15 are located on both outer of the two grooves 13 with respect to the waveguide 11. The waveguide 11 and the grooves 13 extend in the X-axis direction. The waveguide 11 and the terraces 15 is formed of the Si layer 16 of the substrate 10. In the groove 13, the $SiO_2$ layer 14 may be exposed, or the Si layer 16 thinner than the waveguide 11 may be located.

The chips 20 and 40 are bonded to the surface of substrate 10. Compound semiconductor layers included in each of the chips 20 and 40 will be described later. As shown in FIG. 1B, the substrate 10 and the chips 20 and 40 are covered with an insulating film 17. The insulating film 17 is formed of an insulator such as silicon nitride (SiN) having a thickness of 1 μm, for example, and FIG. 1A is seen through the insulating film 17. A refractive index of the insulating film 17 is 1.78, which is lower than that of the other layers such as Si layer 16 and the compound semiconductor layers. Therefore, the insulating film 17 functions as a cladding layer that confines the light into the other layers.

As shown in FIG. 1B, the chip 20 includes a damage relieving layer 36, a cladding layer 34, a light confinement layer 32, an active layer 30, a light confinement layer 28, a cladding layer 26, and a contact layer 24 which are stacked in this order from a side closer to the substrate 10. The light confinement layer 32, the active layer 30, the light confinement layer 28, cladding layer 26, and the contact layer 24 form a mesa 21. The damage relieving layer 36 and the cladding layer 34 extend over a wider range than the mesa 21.

As shown in FIG. 1A, the chip 20 is provided an electrodes 29 and an electrode 31. The electrode 31 as shown in FIG. 1B is a p-type electrode having an ohmic electrode 31a and a wiring layer 31b. The ohmic electrode 31a is, for example, a stacked metal layers of titanium, platinum, and gold (Ti/Pt/Au). The ohmic electrode 31a is provided on the mesa 21, and is in contact with an upper surface of the contact layer 24. The wiring layer 31b is formed of a metal such as gold (Au), and extends from an upper surface of the ohmic electrode 31a to an outside of the mesa 21. The electrode 29 has an ohmic electrode and a wiring layer spaced from the mesa 21, and is provided on a top surface of the cladding layer 34. The ohmic electrode of the electrode 29 is formed of a metal such as Au with an alloy of germanium and Ni (AuGeNi), and the wiring layer of the electrode 29 is formed of a metal such as Au.

As shown in FIG. 1B, the chip 40 has a damage relieving layer 56, a cladding layer 54, a core layer 52 (first semiconductor layer), a grating layer 50 (second semiconductor layer) laminated in order from a side close to the substrate 10. As shown in FIG. 1A, one grating layer 50 is long in the Y-axis direction, and a short rectangle in the X-axis direction. A plurality of the grating layers 50 are located above the waveguide 11 to form a pattern arranged along the X-axis direction. The pattern of the grating layers 50 functions as a grating 60. The grating layers 50 are separated from each other, and a space between them is filled with the insulating film 17.

Figure 1C:
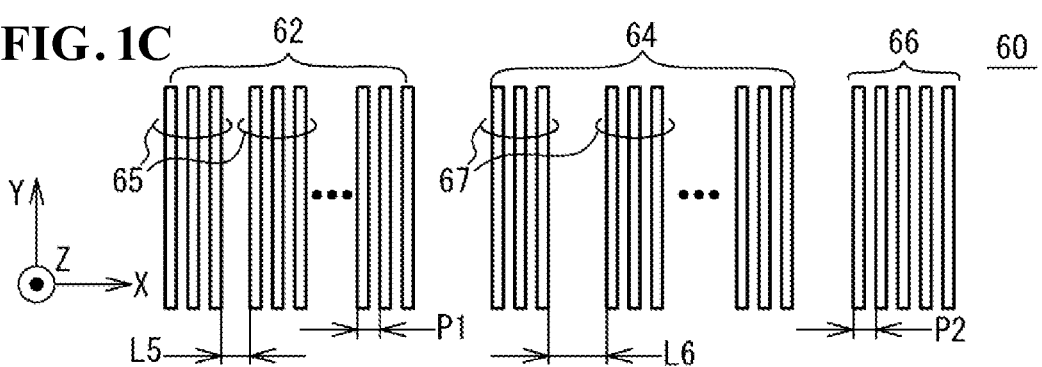
FIG. 1C is an enlarged view illustrating a grating.

FIG. 1C is an enlarged view of the grating 60. The grating 60 includes a sampled grating (SG) 62, a SG 64, and a distributed Bragg reflector (DBR) 66 aligned in order from the −X side to the +X side. The DBR 66 is a reflective portion. The sampled grating 62 (first partial grating) includes a plurality of partial gratings 65 (third partial gratings) aligned in the X-axis direction. The sampled grating 64 (second partial grating) includes a plurality of partial gratings 67 (fourth partial gratings) aligned in the X-axis direction. Each number of partial gratings 65 and 67 is, for example, seven. One of the partial gratings 65 includes three grating layers 50, and one of the partial gratings 67 includes the three grating layers 50, for example. In the sampled grating 62, a distance (spacing) L5 between adjacent partial gratings 65 is, for example, 150 μm. In the sampled grating 64, a distance L6 (spacing) between adjacent partial gratings 67 is different from the distance L5. The distance L6 is, for example 170 μm. A period P1 in the X-axis direction of the grating layer 50 in the partial gratings 65 and 67 is, for example, 240 nm. A refractive index coupling factor of the grating 60 is, for example, 1000 $cm^1$.

The DBR 66 includes, for example, five grating layers 50. A period P2 of adjacent grating layers 50 in the DBR 66 is, for example, 240 nm.

As shown in FIG. 1A, electrodes 43 and 45 are provided on both sides of the Y-axis direction of the grating 60. The electrode 43 and 45 are formed of a metal such as an alloy of titanium and tungsten (TiW). Two electrodes 43 are located on both sides in the Y-axis direction of the partial grating 62. Two electrodes 45 are located on both sides in the Y-axis direction of the partial grating 64.

As shown in FIG. 1A, the chip 20 has tapered portions 23a, 23b, 25a and 25b. The tapered portions 23a and 23b (first tapered portions) are formed of the damage relieving layer 36 and cladding layer 34 (third semiconducting layer), and do not include the active layer 30. The tapered portions 25a and 25b (second tapered portions) are protruded from the mesa 21 and are formed of the light confinement layer 32, the active layer 30, the light confinement layer 28, the cladding layer 26, and the contact layer 24.

The tapered portions 23a, 23b, 25a, and 25b of the chip 20 are located above the waveguide 11 of the substrate 10. Each of the tapered portions extends in the X-axis direction which is the extending direction of the waveguide 11. Tips of the tapered portions 23a, 23b, 25a, and 25b overlap in the X-axis direction. The tapered portions 23a and 25a protrude from a +X side surface of the chip 20, and are tapered to narrow toward the +X direction. The tapered portions 23b and 25b protrude from a −X side surface of the chip 20, and are tapered to narrow toward the −X direction. A length L1 from the +X side surface of the chip 20 to the tip of the tapered portion 23a is, for example, 40 μm. A length L2 from a +X side end of the mesa 21 to the tip of the tapered portion 25a is, for example, 35 μm. Lengths of the tapered portions 23b and 25b are the same as the tapered portions 23a and 25a.

The chip 40 has a tapered portion 41 (third tapered portion). The tapered portion 41 is formed of the damage relieving layer 56, the cladding layer 54, and the core layer 52. The tapered portion 41 is located above the waveguide 11, and extends in the X-axis direction. The tapered portion 41 protrudes toward the −X direction. The tapered portion 41 is tapered to narrow toward the −X direction. A length L3 from a −X side surface of the chip 40 to a tip of the tapered portion 41 is, for example, 80 µm. The tip of the tapered portion 41 faces to the tapered portions 23a and 25a. A distance L4 between the tapered portion 41 and the tapered portion 23a is, for example, m.

As shown in FIG. 1A, a width W1 of a portion of the waveguide 11 where the waveguide 11 overlaps with the chip 20 is, for example, 2 µm. A width W2 of a portion of the waveguide 11 where the waveguide 11 overlaps with the grating 60 is, for example, 0.5 µm. A width of the waveguide 11 continuously changes from W1 to W2, from a portion where the waveguide 11 overlaps with the tapered portion 41 to a portion where the waveguide 11 overlaps with the sampled grating 62. The length of a portion of the waveguide 11 where the width being changed is about 20 µm.

The chip 20 is evanescently optically coupled to the substrate 10, and the chip 40 is also optically coupled to the substrate 10. By applying a voltage to the electrodes 29 and 31 of the chip 20, carriers are injected into the active layer 30, and the active layer 30 emits light. Light propagates through the waveguide 11 of the substrate 10 and enters the chip 40. A wavelength of light is selected by the Vernier effect of the sampled gratings 62 and 64 of the chip 40. The DBR 66 reflects light having the wavelength selected by the sampled gratings 62 and 64. The reflected light propagates through the waveguide 11 to the −X direction, and is emitted from the wavelength tunable laser device 100. The electrodes 43 and 45 provided in the chip 40 function as a heater. A temperature of the grating 60 is changed when a voltage is applied to the electrodes 43 and 45. The refractive index of the compound semiconductor layers included in the chip 40 is changed by changing the temperature, so that the wavelength of light can be changed. That is, the wavelength tunable laser device 100 is a hybrid laser in which the chips 20 and 40 are bonded to the substrate 10, and controls the wavelength by the grating 60 in the chip 40.

An oscillation wavelength of the wavelength tunable laser device 100 is, for example, 1.55 µm. In order to suppress a loss of light, it is preferable that the compound semiconductor layers included in the chips 20 and 40 hardly absorb light. For example, bandgaps of the light confinement layers 28 and 32, the damage relieving layers 36 and 56, and the grating layer 50 correspond to a wavelength of 1.2 µm which is shorter than the oscillation wavelength. A bandgap of the core layer 52 corresponds to a wavelength of 1.3 µm which is also shorter than the oscillation wavelength. By providing a coating film (not shown) on end faces of +X side and −X side of the substrate 10, reflectance of each of the end faces can be adjusted. For example, the reflectance of the −X side end face is about 30% which is higher than the reflectance of the +X side end face.

(Manufacturing Method)

FIG. 2A, FIG. 2B, FIG. 3A, FIG. 3B, FIG. 5A, FIG. 5B, FIG. 6, FIG. 7B, FIG. 8A, FIG. 8B, FIG. 8C, FIG. 9B, FIG. 10B, and FIG. 11B are cross-sectional views illustrating a manufacturing method of a wavelength tunable laser device 100. FIG. 4, FIG. 7A, FIG. 9A, FIG. 10A, and FIG. 11A are plane views illustrating the manufacturing method of the tunable laser device 100.

Figure 2A:
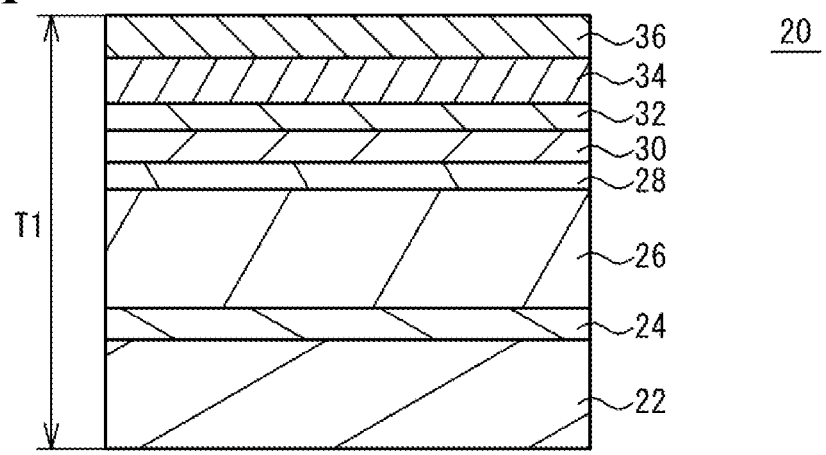
FIG. 2A is a schematic view illustrating a method for manufacturing a wavelength tunable laser device.

As shown in FIG. 2A, a contact layer 24, a cladding layer 26, a light confinement layer 28, an active layer 30, a light confinement layer 32, a cladding layer 34, and a damage relieving layer 36 are epitaxially grown on a substrate 22 by an organometallic vapor phase epitaxy (OMVPE) method.

The substrate 22 is, for example, a wafer formed of n$^+$ type indium phosphide (n$^+$-InP). The contact layer 24 is formed of, for example, p$^+$ type gallium indium arsenide (p$^+$-GaInAs) having a thickness of 200 nm. The cladding layer 26 is formed of, for example, 1500 nm-thick p-InP. The light confinement layers 28 and 32 are formed of, for example, non-doped gallium indium arsenide phosphorous (i-GaInAsP) having a thickness of 100 nm. The active layer 30 includes, for example, five well layers and six barrier layers stacked alternately, and has a multiple quantum well (MQW) structure (first group III-V compound semiconductor). The well layer is formed of 6 nm-thick GaInAsP and the barrier layer is formed of 10 nm-thick GaInAsP. The cladding layer 34 is formed of, for example, n$^+$-InP having a thickness of 200 nm. The damage relieving layer 36 is formed of, for example, a 200 nm-thick i-GaInAsP layer.

The p$^+$ type dopants of the contact layer 24 and the cladding layer 26 are, for example, zinc (Zn). The dopant-concentration of the contact layer 24 is $1 \times 10^{19}$ cm$^{-3}$. The dopant-concentration of the cladding layer 26 is $1 \times 10^{18}$ cm$^{-3}$. The n$^+$ type dopants of the substrate 22 and the cladding layer 34 are, for example, Si. The dopant-concentration of the cladding layer 34 is, for example, $1 \times 10^{18}$ cm$^{-3}$.

Figure 2B:
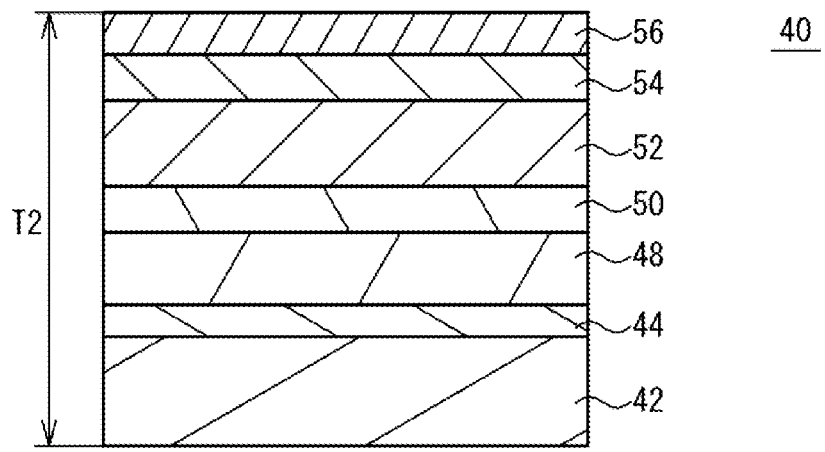
FIG. 2B is a schematic view illustrating a method for manufacturing a wavelength tunable laser device.

As shown in FIG. 2B, an etch-stop layer 44, a cladding layer 48, a grating layer 50, a core layer 52, a cladding layer 54, and a damage relieving layer 56 are epitaxially grown on a substrate 42 in this order, for example, by OMVPE method.

The substrate 42 is, for example, a wafer formed of n$^+$-InP. The etch-stop layer 44 is formed of, for example, an i-GaInAs having a thickness of 200 nm. The grating layer 50 and the damage relieving layer 56 are each formed of, for example, an i-GaInAsP (second group III-V compound semiconductor) having a thickness of 200 nm. The cladding layer 48 is formed of, for example, 1300 nm-thick i-InP. The core layer 52 is formed of, for example, a 290-nm-thick i-GaInAsP layer. The cladding layer 54 is formed of, for example, 200 nm-thick i-InP.

After the epitaxial growth, a plurality of chips 20 are obtained by dividing the substrate 22 by dicing. A plurality of chips 40 are obtained by dividing the substrate 42 by dicing. Immediately after the dividing, a thickness T1 of the chip 20 is equal to a thickness T2 of the chip 40. The chips 20 and 40 are, for example, bar-shaped rectangles, and are arranged on a susceptor (not shown). A length of a side in the Y-axis direction of each of the chips 20 and 40 is 35 mm. A length of a side in the X-axis direction is 2 mm. A Si layer 16 of a substrate 10 is etched to form a groove 13 and a waveguide 11.

Figure 3A:
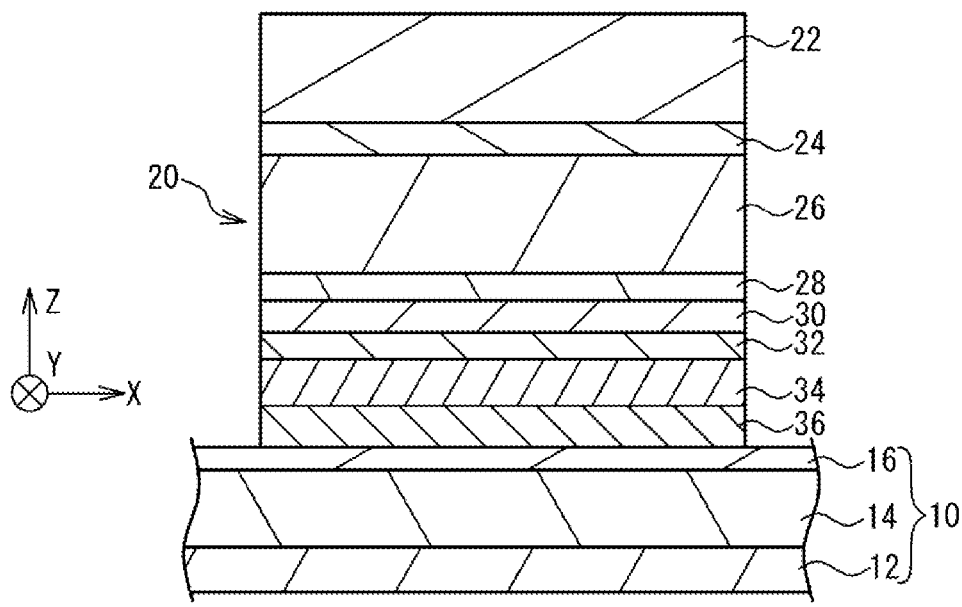
FIG. 3A is a schematic view illustrating a method for manufacturing a wavelength tunable laser device.
Figure 3B:
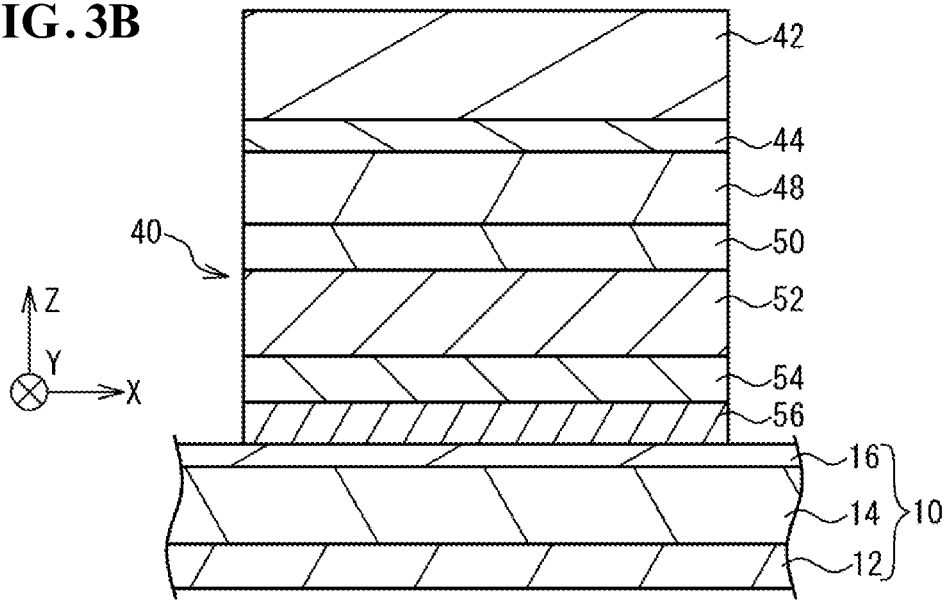
FIG. 3B is a schematic view illustrating a method for manufacturing a wavelength tunable laser device.
Figure 4:
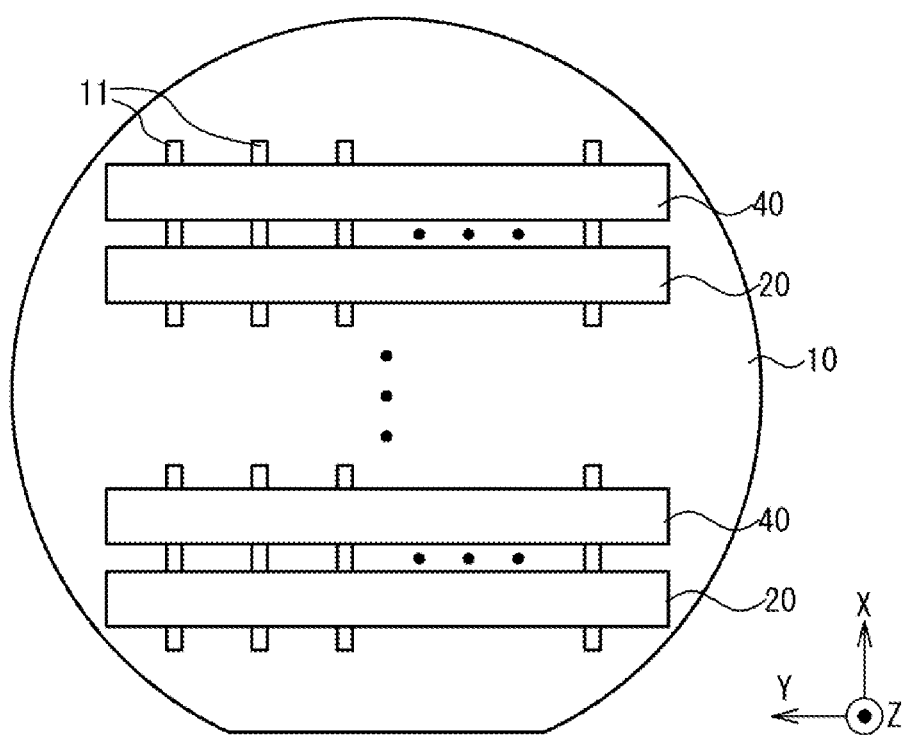
FIG. 4 is a schematic view illustrating a method for manufacturing a wavelength tunable laser device.

The damage relieving layer 36 of the chip 20 and the damage relieving layer 56 of the chip 40 are irradiated with N$_2$ plasmas to activate surfaces, and to generate atomic dangling bonds on the surfaces. The substrate 10 is also exposed to N$_2$ plasmas to activate a surface. As shown in FIG. 3A and FIG. 3B, the chips 20 and 40 are placed on the substrate 10 such that the damage relieving layers 36 and 56 are in contact with the surface of the substrate 10, and then the chips 20 and 40 are temporary bonded to the substrate 10. After the temporary bonding is performed in a vacuum, a temperature of the substrate 10 is set to, for example, 200° C. The chips 20 and 40 are pressed toward the substrate 10, and annealing is performed for 2 hours. After the annealing, the chips 20 and 40 are bonded to the substrate 10. Since the thicknesses of the chips 20 and 40 are equal, a load during being pressed is applied evenly to the chips 20 and 40. Thus, variations of bonding strength among the chips 20 and 40 is reduced. As shown in FIG. 4, the chips 20 and 40 cross over a plurality of the waveguides 11 and face each other.

Figure 5A:
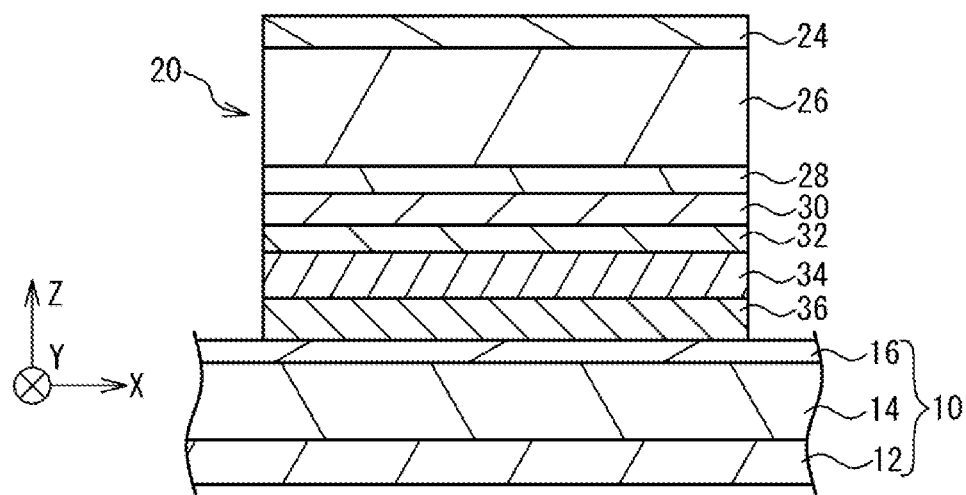
FIG. 5A is a schematic view illustrating a method for manufacturing a wavelength tunable laser device.
Figure 5B:
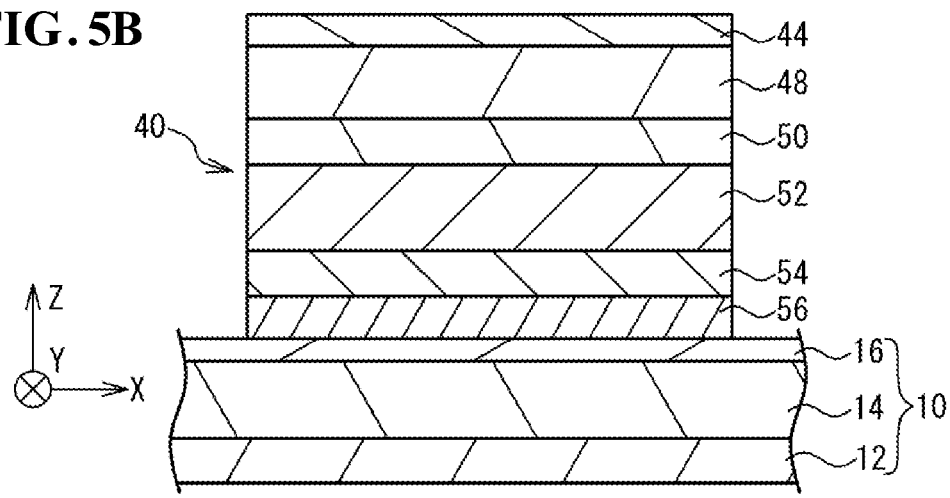
FIG. 5B is a schematic view illustrating a method for manufacturing a wavelength tunable laser device.

As shown in FIG. 5A and FIG. 5B, the chips 20 and 40 are subjected to wet etching using, for example, hydrochloric acid as an etchant. By wet etching, the substrate 22 of each of the chips 20 is removed. The wet etching stops at the contact layer 24, and the contact layer 24 is exposed to a surface of the chip 20. The substrate 42 of each of the chips 40 is removed by wet etching. The wet etching stops at the etch-stop layer 44, and the etch-stop layer 44 is exposed to a surface of the chip 40.

Figure 6:
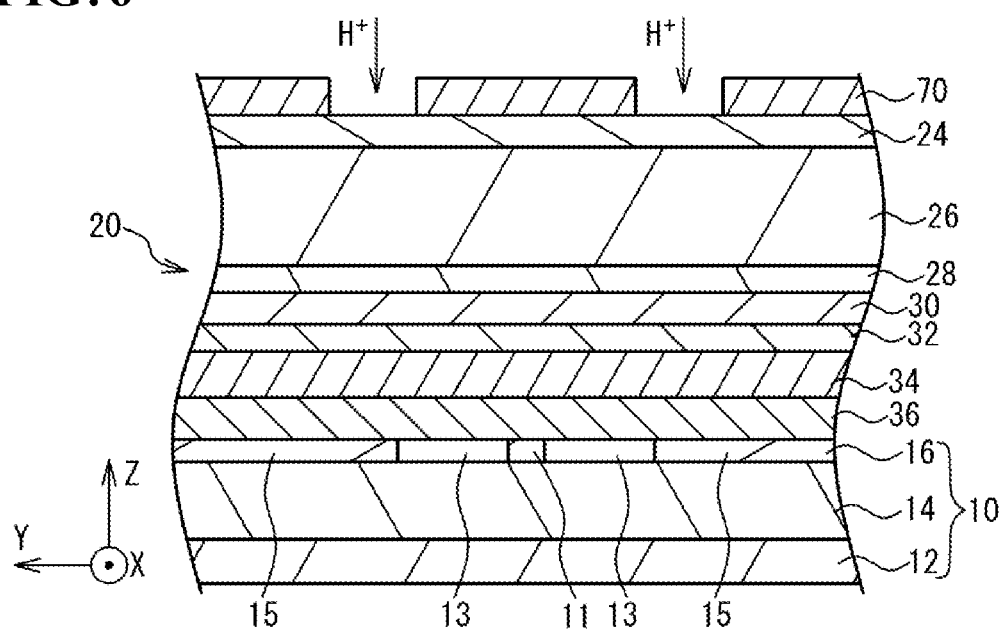
FIG. 6 is a schematic view illustrating a method for manufacturing a wavelength tunable laser device.

As shown in FIG. 6, a resist mask 70 is provided on the contact layer 24 of the chip 20. Ions such as hydrogen ions ($H^+$) are implanted from opening portion of the resist mask 70 into the portion of the chip 20 that does not overlap with the waveguide 11. The contact layer 24 and the cladding layer 26 are ion-implanted, are disordered, and become current-constricted regions. The non-ion-implanted region is, for example, a region for current injection having a width of 2 μm. The chip 40 is not subjected to the ion implantation.

Figure 7A:
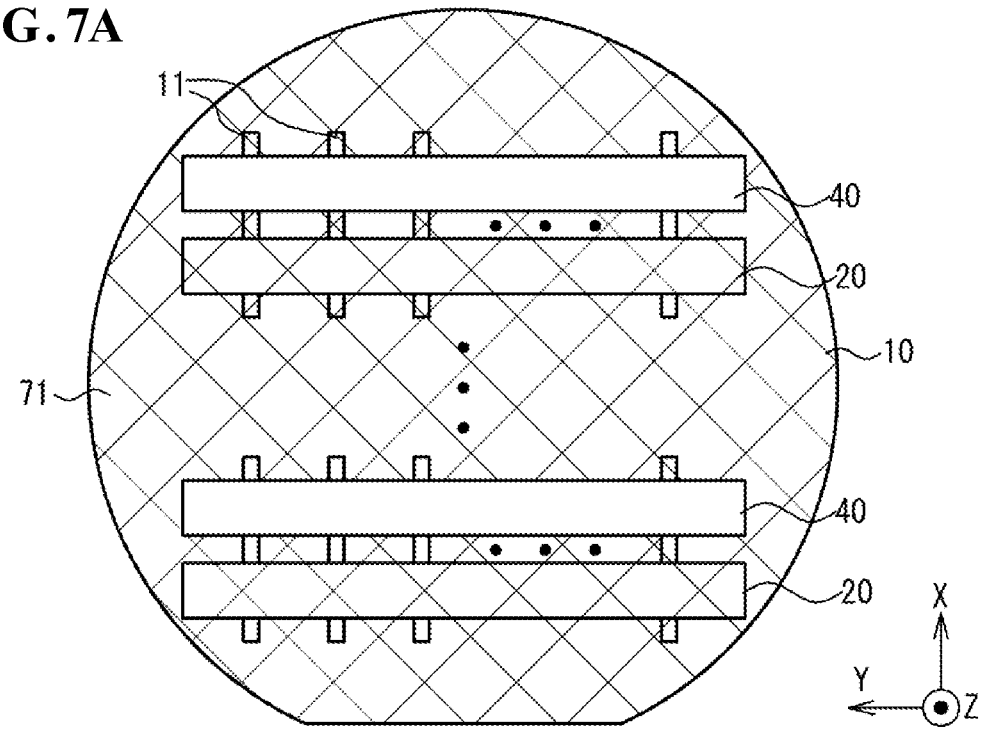
FIG. 7A is a schematic view illustrating a method for manufacturing a wavelength tunable laser device.
Figure 7B:
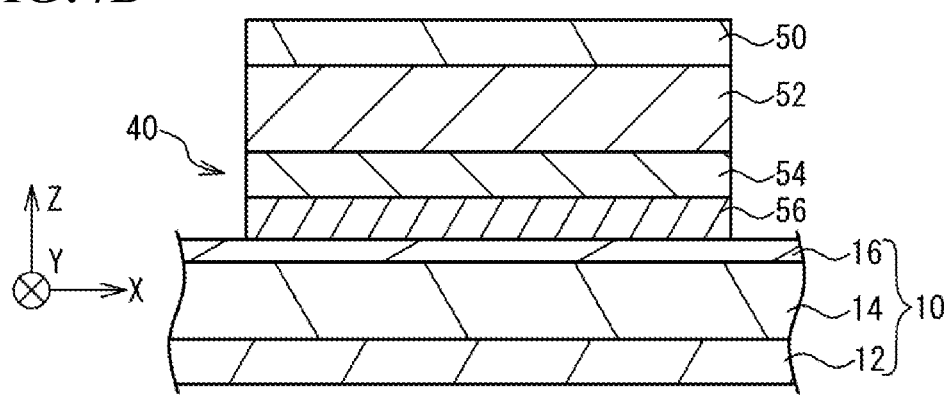
FIG. 7B is a schematic view illustrating a method for manufacturing a wavelength tunable laser device.

The substrate 10 is covered with an insulating film such as SiN having a thickness of 100 nm. A resist pattern is transferred to the insulating film by etching with buffered hydrofluoric acid (BHF) or the like, and a mask 71 is formed from the insulating film. As shown in FIG. 7A, the substrates 10 and the chips 20 are covered with the mask 71, and the chips 40 are exposed from the mask 71. As shown in FIG. 7B, the etch-stop layer 44 of the chip 40 is removed by wet etching using, for example, a sulfuric acid ($H_2SO_4$) based etchant, and the cladding layer 48 is removed by wet etching using a hydrochloric acid (HCl) based etchant. After the wet etching, the grating layer 50 is exposed to a surface. The mask 71 is removed.

Figure 8A:
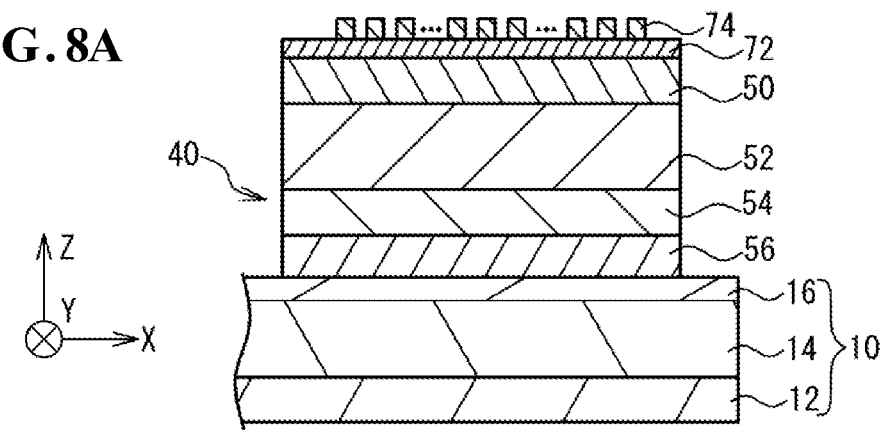
FIG. 8A is a schematic view illustrating a method for manufacturing a wavelength tunable laser device.

As shown in FIG. 8A, a mask 72 of an insulating film is formed on the grating layer 50 of the chip 40 by, for example, plasma-enhanced chemical vapor deposition (CVD) method. The mask 72 is, for example, a $SiO_2$ film having a thickness of 50 nm. A resist mask 74 is provided on the mask 72 and patterned by an electron-beam (EB) lithography. The resist mask 74 has a pattern corresponding to the grating 60 shown in FIG. 1A to FIG. 1C.

Figure 8B:
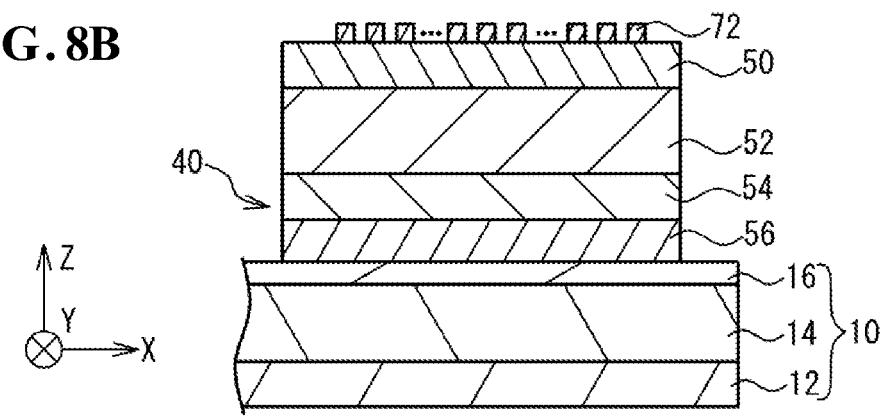
FIG. 8B is a schematic view illustrating a method for manufacturing a wavelength tunable laser device.
Figure 8C:
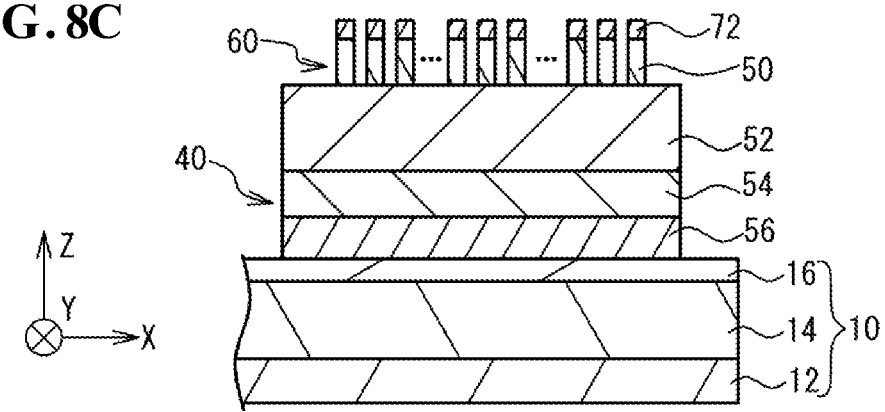
FIG. 8C is a schematic view illustrating a method for manufacturing a wavelength tunable laser device.

As shown in FIG. 8B, the pattern of the resist mask 74 is transferred to the mask 72 by reactive ion etching (RIE) using methane tetrafluoride ($CF_4$) gas. As shown in FIG. 8C, the RIE is performed on the grating layers 50 using the mask 72 and an etchant such as $CH_4/H_2$. Thus, the grating 60 is formed. As shown in FIG. 4, a plurality of gratings 60 are formed arranged along the Y-axis direction in the chips 40 having bar-shapes. The chip 20 is covered with the mask 72, and is not etched. After the etching, the mask 72 is removed by BHF.

Figure 9A:
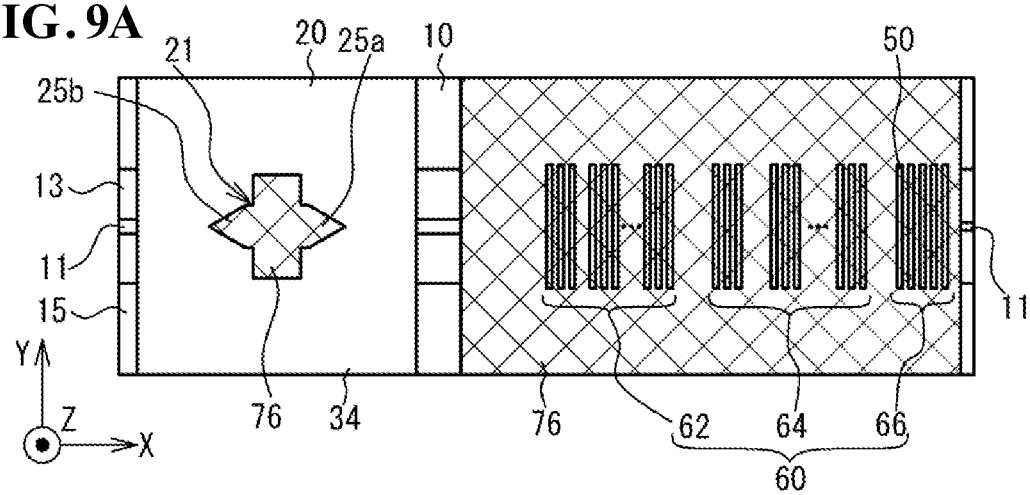
FIG. 9A is a schematic view illustrating a method for manufacturing a wavelength tunable laser device.
Figure 9B:
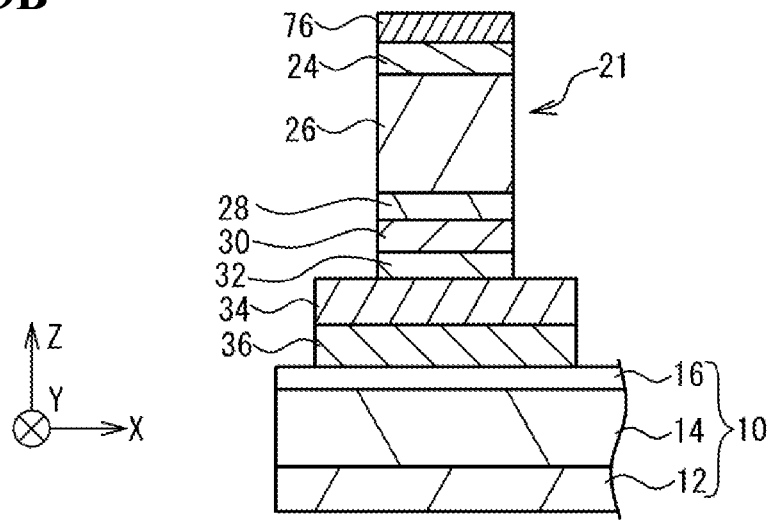
FIG. 9B is a schematic view illustrating a method for manufacturing a wavelength tunable laser device.

An insulating film of SiN having a thickness of 300 nm is formed by CVD method. A pattern is formed by photolithography on a resist applied on the insulating film. The pattern of the resist is transferred to the insulating film by RIE using $CF_4$ gas to form a mask 76 of the insulating film. The mask 76, shown as hatched in FIG. 9A, covers the chip 40 and a portion of the chip 20. As shown in FIG. 9A and FIG. 9B, the portions of the chips 20 that are exposed from the mask 76 are removed with RIEs using $CH_4/H_2$. As a result, the mesa 21 and the tapered portions 25a and 25b are formed. As shown in FIG. 4, the chip 20 is bar-shaped, and a plurality of mesas 21 are formed along the Y-axis direction, accompanied with a plurality of the tapered portions 25a and 25b. After the RIE, the mask 76 is removed by BHF.

Figure 10A:
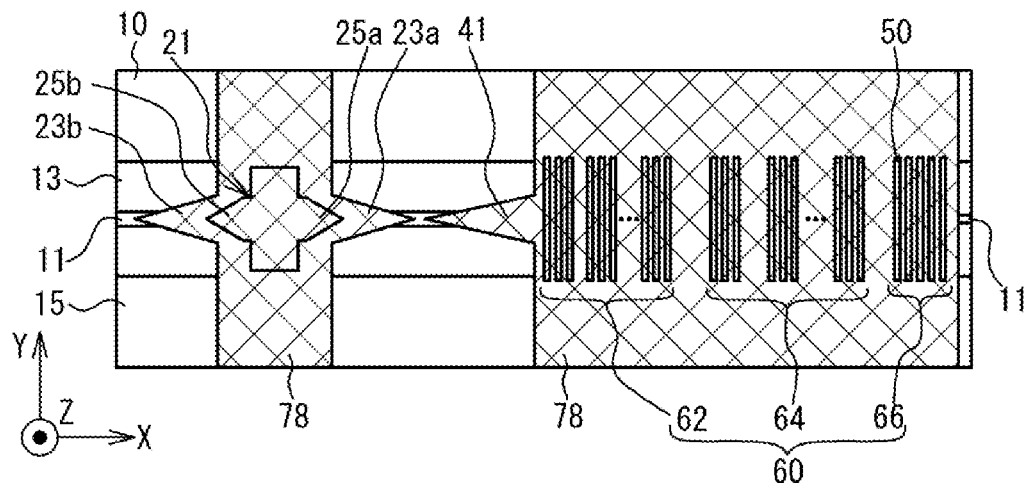
FIG. 10A is a schematic view illustrating a method for manufacturing a wavelength tunable laser device.
Figure 10B:
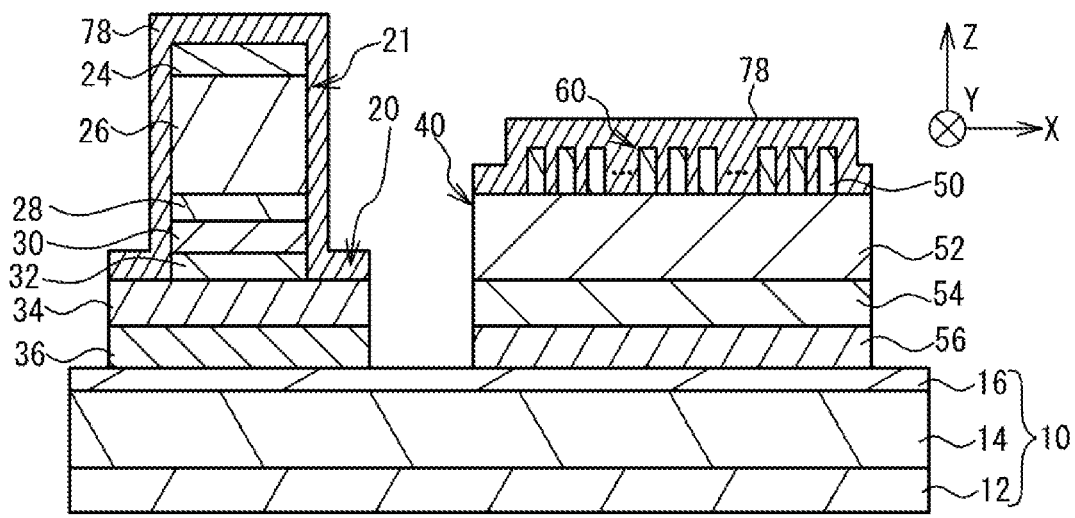
FIG. 10B is a schematic view illustrating a method for manufacturing a wavelength tunable laser device.

As shown in FIG. 10A and FIG. 10B, a mask 78 of the insulating film is formed on the chips 20 and 40 in the same manner as the mask 76. RIE using $CH_4/H_2$ is performed to the portion of the chips 20 exposed from the mask 78 to form a tapered portions 23a and 23b. RIE using $CH_4/H_2$ is performed to the portion of the chips 40 exposed from the mask 78 to form a tapered portion 41. The mask 78 is removed by BHF.

Figure 11A:
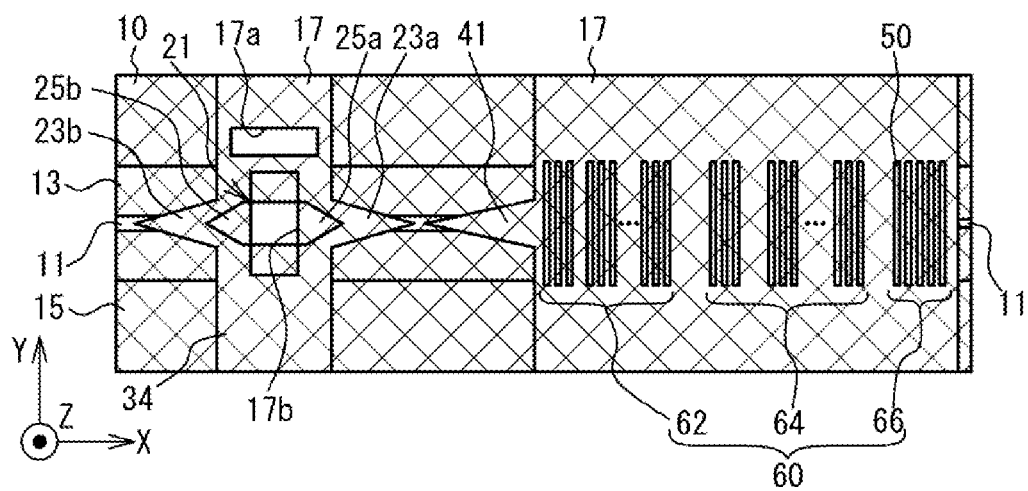
FIG. 11A is a schematic view illustrating a method for manufacturing a wavelength tunable laser device.
Figure 11B:
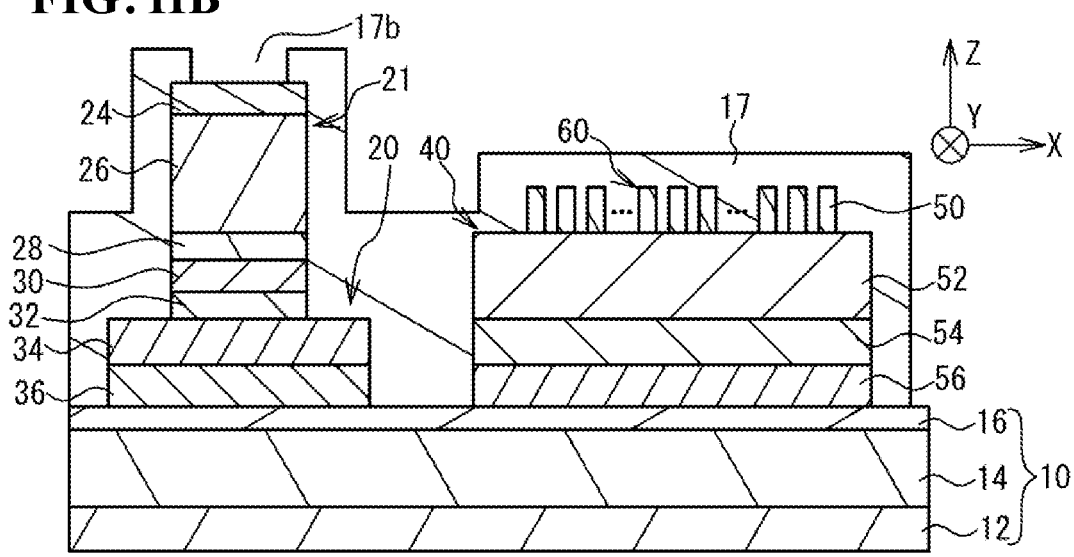
FIG. 11B is a schematic view illustrating a method for manufacturing a wavelength tunable laser device.

As shown in FIG. 11A and FIG. 11B, an insulating film 17 covering the chips 20 and 40 is formed by CVD method. As shown in FIG. 11A, an opening portion 17a is formed at a position separated from the mesa 21 of the insulating film 17 by RIE using $CF_4$, and an opening portion 17b is formed on the mesa 21. The cladding layer 34 is exposed in the opening portion 17a, and the contact layer 24 is exposed in the opening portion 17b.

Resist patterns are formed on the insulating film 17 by photolithography. By evaporation and lift-off are performed, and an ohmic electrode of an electrode 29 is formed on the chip 20. Furthermore, by forming a resist pattern, performing vapor deposition and lift-off, an ohmic electrode 31a of the electrode 31 is formed on the chip 20. A wiring layer 31b is formed on the ohmic electrode 31a by plating. Electrodes 43 and 45 are formed on the chip 40 by resist pattern formation, evaporation, and lift-off.

The substrate 10 is divided by dicing so as to include bar-shaped chips 20 and 40. A bar including a plurality of wavelength tunable laser devices 100 is formed. On an end face of the bar of the substrate 10, a coating film is formed to adjust the reflectance.

According to the embodiment, two-photon absorption can be suppressed. The refractive index of the Si layer 16 of the substrate 10 is 3.45. Light confinement in the Si layer 16 is strong, two-photon absorption is likely to occur. On the other hand, the refractive index of the damage relieving layer 56 and the grating layer 50 of the chip 40 is 3.33, the refractive index of the cladding layer 54 is 3.17, the refractive index of the core layer 52 is 3.37. These refractive indices are lower than that of the Si layer 16. Therefore, light confinement in the chip 40 is weaker than that in the Si layer 16, and two-photon absorption hardly occurs in the chip 40.

In the embodiment, the chips 20 and 40 are bonded to the substrate 10 which is the SOI substrate. The chip 40 has the grating 60 formed of a group III-V compound semiconductor such as GaInAsP. As described above, since the wavelength is controlled by the chip 40 in which the light confinement is weak and the two-photon absorption hardly occurs, the two-photon absorption is suppressed. Due to the suppression of the two-photon absorption, a shift of the oscillation wavelength and an enhancement of a spectral linewidth are also suppressed. As a result, the wavelength is controlled to the desired accuracy, and stable tunable laser characteristics can be obtained.

Two-photon absorption is unlikely to occur even when intense light is incident on the chip 40. Therefore, it is not necessary to branch the waveguide 11 to reduce the intensity of light. As a result, the loss of light is suppressed, and it is possible to miniaturize the wavelength tunable laser device 100.

As shown in FIG. 1C, the grating 60 has the sampled gratings 62, 64 and the DBR 66 arranged in order from the chip 20. The Vernier effect of the sampled gratings 62 and 64 controls the wavelength of light. Light having a selected wavelength is reflected by the DBR 66 back to the chip 20, and is emitted to the outside of the wavelength tunable laser device 100. Since the control of the wavelength and the reflection of light is performed by the grating 60 of the chip 40 in which the two-photon absorption is less likely to occur, stable tunable laser characteristics can be obtained.

The sampled grating 62 includes a plurality of the partial gratings 65, and the sampled grating 64 includes a plurality of the partial gratings 67. The distance L5 between the adjacent partial gratings 65 is different from the distance L6 between the adjacent partial gratings 67. The Vernier effects of the sampled gratings 62 and 64 allow wavelength sweep. Therefore it is possible to stably control the oscillation wavelength.

The chip 40 has the core layer 52 and the grating layer 50. The grating 60 is formed of a plurality of the grating layers 50 aligned in the X-axis direction. The core layer 52 and the grating layer 50 are formed of a group III-V compound semiconductor, and has a lower refractive index than Si. Further, the difference in the refractive indices of these layers is smaller than the difference between the insulating film 17 and the Si layer 16 of the waveguide 11, thus optical confinement in the grating 60 is weaker compared to that in the waveguide 11. Thus, two-photon absorption is less likely to occur in the diffraction grating 60. Therefore, stable tunable laser characteristics can be obtained.

The core layer 52 and the grating layer 50 are formed of i-GaInAsP. Since the light confinement in i-GaInAsP is weaker than in Si, two-photon absorption is less likely to occur in the chip 40 as compared with the waveguide 11. Therefore, stable tunable laser characteristics can be obtained. In order to suppress two-photon absorptions, the core layer 52 and the grating layer 50 may be formed of compound semiconductors other than i-GaInAsP, and may be formed of, for example, a group III-V compound semiconductor containing In and P.

The substrate 10 is a substrate containing Si, and is, for example, an SOI substrate. The waveguide 11 is formed in the Si layer 16 of the substrate 10. The refractive index of the Si layer 16 is high, two-photon absorption is likely to occur. Especially two-photon absorption is likely to occur when high intensity light is incident on such a ring resonator of Si. In order to suppress two-photon absorption, it is preferable not to form an optical circuit for selecting a wavelength such as a ring resonator to the Si layer 16. In the embodiment, since the grating 60 of the chip 40 selects a wavelength, two-photon absorption can be suppressed and light of a desired wavelength can be emitted.

The electrodes 43 and 45 provided on the chip 40 functions as a heater for heating by the application of a voltage, to change the temperature of the grating 60. The refractive index of the grating 60 is changed by the temperature change, it is possible to adjust the oscillation wavelength.

The chip 20 has the tapered portions 23a, 23b, 25a, and 25b above the waveguide 11. This makes it possible to enhance evanescent optical couplings between the chip 20 and the waveguide 11. In particular, since the tapered portions 23a and 23b are longer than the tapered portions 25a and 25b, the optical coupling efficiency between the chip 20 and the waveguide 11 is further improved. The tapered portions 23a and 23b include the cladding layer 34, since the active layer 30 is not included in the tapered portions 23a and 23b, light is less absorbed. Therefore, the loss of light is suppressed.

The tapered portions 25a and 25b include the active layer 30, and the tapered portions 25a and 25b are not provided with the electrode 31. A portion of the active layer 30 that does not overlap with the electrode 31 tends to absorb light. When the lengths of the tapered portions 25a and 25b, saturable absorption tends to occur by the active layer 30 contained in the tapered portions 25a and 25b. The tapered portions 25a and 25b of the embodiment is shorter than the tapered portions 23a and 23b. Therefore, saturable absorption hardly occurs, and light loss is suppressed.

The chip 40 disposed on the waveguide 11 has a tapered portion 41 at an end facing to the chip 20. Optical coupling efficiency between the chip 40 and the waveguide 11 is increased. Light propagating through the waveguide 11 is less likely to be reflected at the end of the chip 40, easily incident on the chip 40 due to the tapered portion 41.

As shown in FIG. 2A and FIG. 2B, the thickness T1 of the chip 20 and the thickness T2 of the chip 40 are equal. Therefore, the load is applied evenly to the chip 20 and the chip 40 during bonding, it is possible to increase the bonding strength of the chips 20 and 40 with the waveguide 11. The mesa 21, the grating 60 may be formed prior to bonding. However, forming the mesa 21 and the grating 60 reduces the flatness of the top surface of the chips 20 and 40. In addition, when the mesa 21 or the grating 60 are formed prior to bonding, the thickness of the chip 20 and the thickness of the chip 40 become different with each other at the bonding. Therefore it may become difficult to bond the chips 20 and 40 to the substrate 10 under an equal weighting. To equalize the weighting for reducing the variation of the bonding strength, the chips 20 before the mesa 21 formation, and the chips 40 before the grating 60 formation are bonded to the substrate 10. It is preferable to form the mesa 21 and the grating 60 after the bonding.

The tapered portions 23a, 23b, 25a, 25b, and 41 may be formed before bonding. However, it is difficult to align the tapered portions and a center of the waveguide 11 at the bonding. In the present embodiment, as shown in FIG. 9A and FIG. 10A, the tapered portions of the chips 20 and 40 are formed using the lithography after the bonding. Accuracy of alignment between the tapered portion and the waveguide 11 is improved.

In the present embodiment, plasma activated bonding is performed in which the chips 20 and 40 together with the surface of the substrate 10 are activated by plasma irradiation. The chips 20 and 40 may be formed by another process such as, etching a sacrificial layer, separating the chips from a wafer, and bonding the chips to the substrate 10 by transfer printing. The chips 20 and 40 may have other shapes other than the bar-shapes. The wavelength tunable laser device 100 may have other shapes other than the bar-shape.

Although embodiments of the present disclosure have been described in detail above, the present disclosure is not limited to these embodiments. Rather, various changes and modifications can be made within the spirit of the disclosure as set forth in the claims.

What is claimed is:

1. A wavelength tunable laser device comprising:
   a substrate including silicon, the substrate having a waveguide;
   a first semiconductor element bonded to the substrate, the first semiconductor element including an active layer of a group III-V compound semiconductor; and
   a second semiconductor element bonded to the substrate, the second semiconductor element facing to the first semiconductor element in a direction along which light emitted from the first semiconductor element propagates, the second semiconductor element including a grating formed of a group III-V compound semiconductor, wherein
   the grating selects a wavelength of the light,
   the second semiconductor element includes a first semiconductor layer and a second semiconductor layer stacked in order and formed of group III-V compound semiconductors, and
   the grating includes a plurality of the second semiconductor layers arranged along the extending direction of the waveguide.

2. The wavelength tunable laser device according to claim 1, wherein
the grating includes a first partial grating, a second partial grating, and a reflecting portion arranged in order from a side of the first semiconductor element along an extending direction of the waveguide,
the first partial grating and the second partial grating select the wavelength of the light, and
the reflecting portion reflects the light having the wavelength.

3. The wavelength tunable laser device according to claim 2, wherein
the first partial grating includes a plurality of third partial gratings,
the second partial grating includes a plurality of fourth partial gratings, and
each of the third partial gratings is arranged apart from each other by a distance different from a distance that each of the fourth partial gratings is arranged apart from.

4. The wavelength tunable laser device according to claim 1, wherein
the first semiconductor layer and the second semiconductor layer are formed of a compound semiconductor containing indium and phosphorus.

5. The wavelength tunable laser device according to claim 1, wherein
the first semiconductor element includes a first electrode, a second electrode, a third semiconductor layer, the active layer, and a fourth semiconductor layer, the third semiconductor layer, the active layer, the fourth semiconductor layer being stacked in order,
the third semiconductor layer is located on the waveguide and has a first tapered portion tapered along an extending direction of the waveguide,
the active layer and the fourth semiconductor layer are located over the waveguide and have a second tapered portion tapered along the extending direction of the waveguide,
the first tapered portion is longer than the second tapered portion,
the first electrode is provided on the third semiconductor layer, and
the second electrode is provided on the fourth semiconductor layer and not provided on the second tapered portion.

6. The wavelength tunable laser device according to claim 5, wherein
the second semiconductor element faces to the first semiconductor element and is located on the waveguide, and
the second semiconductor element has a third tapered portion narrowed along an extending direction of the waveguide.

7. The wavelength tunable laser device according to claim 1, wherein
the substrate includes a silicon oxide layer and a silicon layer stacked on the silicon oxide layer, and
the waveguide is formed of the silicon layer.

8. A method for manufacturing a wavelength tunable laser device comprising steps of:
bonding a first semiconductor element to a substrate, the first semiconductor element including an active layer of a first group III-V compound semiconductor, the substrate having a waveguide;
bonding a second semiconductor element to the substrate at a position of the substrate facing to the first semiconductor element in a direction along which a light emitted from the first semiconductor element propagates; and
forming a grating of a second group III-V compound semiconductor on the second semiconductor element for selecting a wavelength of the light, wherein
the first semiconductor element and the second semiconductor element each has a equal thickness, and
the step of forming the grating is performed after the steps of bonding the first semiconductor element and bonding the second semiconductor element.

* * * * *